United States Patent [19]
Khieu

[11] Patent Number: 5,243,237
[45] Date of Patent: Sep. 7, 1993

[54] NONINVERTING BI-CMOS GATES WITH PROPAGATION DELAYS OF A SINGLE BI-CMOS INVERTER

[75] Inventor: Cong Khieu, San Jose, Calif.

[73] Assignee: Samsung Semiconductor, Inc., San Jose, Calif.

[21] Appl. No.: 824,630

[22] Filed: Jan. 22, 1992

[51] Int. Cl.[5] .............................................. H03K 19/02
[52] U.S. Cl. .................................... 307/446; 307/443
[58] Field of Search ............... 307/446, 570, 584, 585, 307/451, 443

[56] References Cited

U.S. PATENT DOCUMENTS

| | | | |
|---|---|---|---|
| 4,633,220 | 12/1986 | Burgess | 307/451 |
| 4,703,203 | 10/1987 | Gallup et al. | 307/570 |
| 4,890,017 | 12/1989 | Masuda et al. | 307/443 |
| 4,948,994 | 8/1990 | Akioka et al. | 307/451 |
| 5,107,142 | 4/1992 | Bhamidipaty | 307/570 |
| 5,148,052 | 9/1992 | Yellamilli | 307/585 |

Primary Examiner—Edward P. Westin
Assistant Examiner—Jon Santamauro
Attorney, Agent, or Firm—Skjerven, Morrill, MacPherson, Franklin & Friel

[57] ABSTRACT

In a noninverting Bi-CMOS gate, one or more passgates are utilized in the control path leading to a bipolar output transistor which switches the output of the Bi-CMOS gate. The control gate of one of the MOS transistors of a passgate is connected to an input signal of the Bi-CMOS gate. The control gate of the other MOS transistor is connected to the complement of the input signal. The output of the passgate is connected to the base of the bipolar output transistor. More than one such passgate connected to an input signal and its complement can be used. If multiple passgates are used, the outputs of the passgates may be tied together. This technique, utilizing the switching of the passgates with the input signals and their complements, is employed to create a family of Bi-CMOS noninverting gates such as buffers and AND gates. The propagation delay through the noninverting Bi-CMOS gates of the present invention are roughly equal to the propagation delay of a single Bi-CMOS inverter.

28 Claims, 4 Drawing Sheets

NONINVERTING BI-CMOS GATES WITH PROPAGATION DELAYS OF A SINGLE BI-CMOS INVERTER

BACKGROUND OF THE INVENTION

1. Field of the Invention

This invention relates to noninverting Bi-CMOS logic gates, and particularly to Bi-CMOS logic gates such as buffers and AND gates, the propagation delays of which are roughly equal to the propagation delay through a single Bi-CMOS inverter.

2. Related Art

A multitude of digital design applications involve placing a noninverting buffer element in a signal path. Conventional noninverting buffer elements in Bi-CMOS technology, however, actually comprise two Bi-CMOS inverters connected in series. The output of a first Bi-CMOS inverter is linked to the input of the second Bi-CMOS inverter. The output of this second Bi-CMOS inverter is the output of the buffer. Such conventional Bi-CMOS buffers, therefore, introduce roughly twice the propagation delay into the signal path than a single Bi-CMOS inverter does.

This large propagation delay of Bi-CMOS buffers is highly undesirable in many applications. In a Bi-CMOS static RAM, for example, the access time between the time when the address appears at the address input pins and the time when the static RAM actually outputs the data is critical. Great expense is directed to reducing this propagation delay.

Inside a static RAM, an address decoder decodes the address onto a series of decoder output lines. Each of the output lines is associated with a memory block. Accordingly, when an address is decoded, one of the output lines is activated. Activation of this output line indicates the memory block to which the address is mapped. Due to the architecture of the decoder, however, both the active high and active low versions of each address input line is required as an input into the decoder.

FIG. 1 (PRIOR ART) shows address input line signal A passing through inverter INV1 so that inverted signal A* is produced. This output is delayed with respect to the address input line signal A by the inverter propagation delay of INV1. Noninverting buffer BUF1 is provided to produce signal A(delayed). Because buffer BUF1 really comprises two inverters, signal A(delayed) is delayed with respect to the address input line signal A by two inverter delays. Therefore, the A(delayed) signal is delayed with respect to the signal A* by one inverter delay. If no buffer were provided, one inverter delay would still exist between signal A* and signal A.

Due to the multiple problems confronting digital designers including the above described time skew problem, it would be desirable to have a Bi-CMOS buffer circuit as well as other noninverting logic gates which have the same delay as a single Bi-CMOS inverter. The speed of the slowest path through the decoder could be increased. Furthermore, because the skew between signals A* and A(delayed) would be reduced, the inputs to the decoder could be readily altered in the event that the decoding logic should be changed.

FIG. 2 (PRIOR ART) is a circuit diagram of a conventional Bi-CMOS inverter. When the voltage on the input 1 to the inverter transitions from a high digital logic voltage to a low digital logic voltage, P channel transistor Q1 turns on and N channel transistor Q2 turns off. As a result, node N1 is driven high, the voltage on the base of bipolar output transistor Q3 increases, and bipolar transistor Q3 turns on. When the voltage on input 1 transition from high to low, N channel transistor Q4 is also turned off. As a result node N2 is pulled low through resistance R1 thereby turning bipolar output transistor Q5 off. With bipolar output transistor Q3 being on and bipolar output transistor Q5 being off, the output 2 of the Bi-CMOS inverter transitions from low to high.

In the case of input 1 transitioning high, node N1 goes low to turn bipolar transistor Q3 off. Transistor Q4 is also turned on. Charge stored in the base of transistor Q5 will pass through transistor Q4, to the collector of now saturated transistor Q5, through transistor Q5 and to ground The voltage on the base of bipolar transistor Q5 therefore increases and bipolar transistor Q5 is turned on. Because bipolar transistor Q5 is on and bipolar transistor Q3 is off, the voltage on the output 2 of the conventional Bi-CMOS inverter transitions from high to low.

SUMMARY OF THE INVENTION

In a noninverting Bi-CMOS gate of the present invention, one or more passgates are utilized in the control path leading to a bipolar output transistor. This bipolar output transistor switches the output of the Bi-CMOS gate. The control gate of one of the MOS transistors of each passgate is connected to an input signal. The control gate of the other MOS transistor of each passgate is connected to the complement of the input signal. Because the input signal is directly connected to the control gate of one of the MOS transistors of the passgate, one transistor of the passgate begins switching immediately upon the transition of the input signal. This allows the output of the passgate to begin changing the voltage on the base of the bipolar output transistor immediately after the MOS transistor connected to the input signal switches.

The other MOS transistor of the passgate is controlled by the complement of the input signal. Accordingly, the complement arrives at the gate of the other MOS transistor of the passgate after an inverter propagation delay. After this delay, the complement signal switches the other MOS transistor in the passgate, thereby causing each passgate to be turned either completely on or off. When the passgate turns completely on or off, the voltage on the base of the bipolar output transistor completes its voltage transition to switch the bipolar output transistor.

This technique utilizing passgates is employed to create a family of Bi-CMOS noninverting gates such as buffers, AND gates and complex gates, the propagation of the family being roughly equal to the propagation delay of a single Bi-CMOS inverter. Members of this new family of Bi-CMOS gates can be cascaded with each other and can also drive other Bi-CMOS gates.

DETAILED DESCRIPTION OF THE PREFERRED EMBODIMENT

In the following discussion, the operation of the present invention is described by denoting certain nodes transitioning high or low or having certain voltages. It is to be understood, however, that this terminology is used only to simplify the explanation for the reader and that the bipolar transistors in the invention are actually standard bipolar transistors whose operation is well characterized by base, collector and emitter currents as well as terminal voltages.

Figure 3:
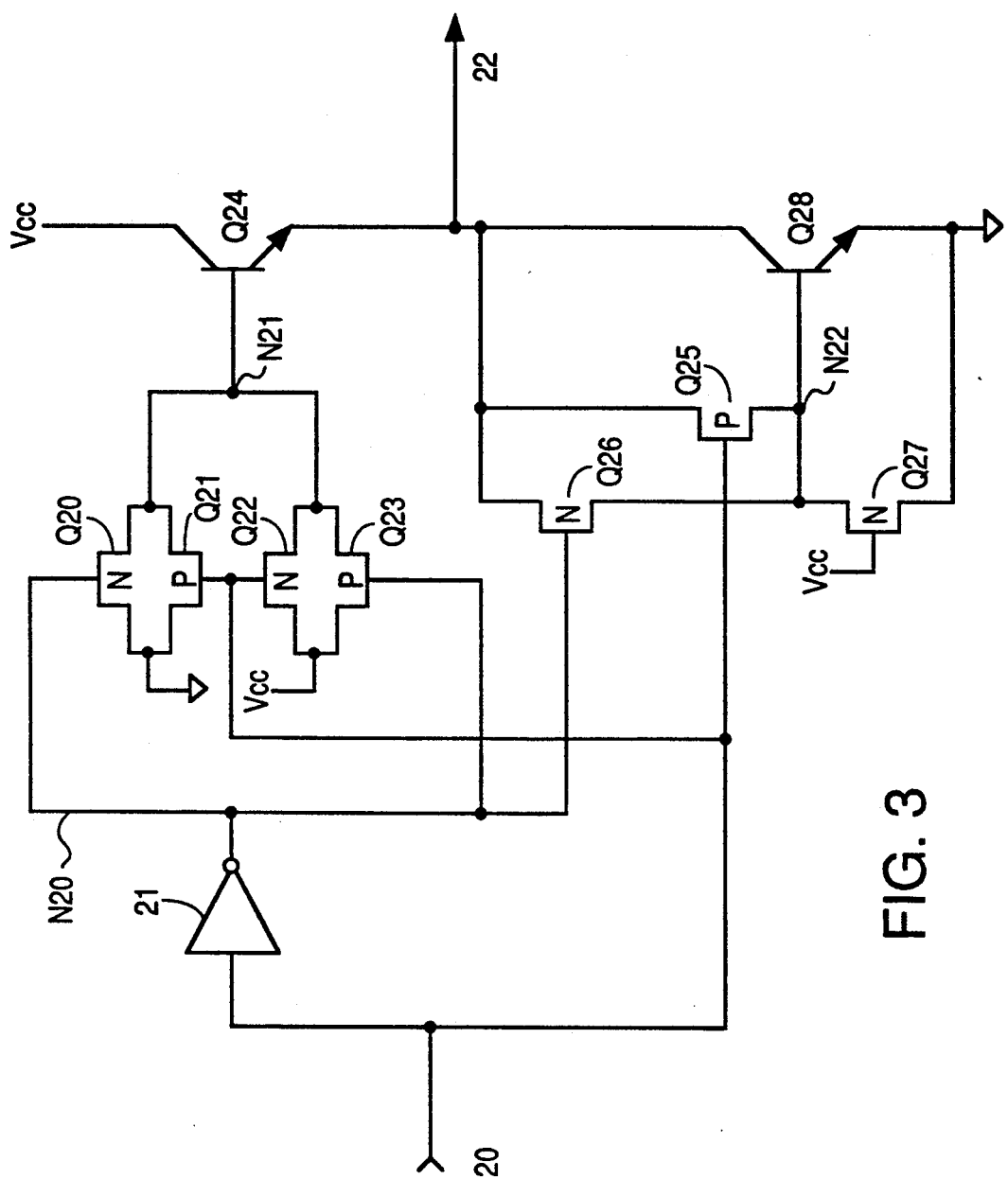
FIG. 3 is a diagram of an example of a noninverting Bi-CMOS buffer according to the present invention.

FIG. 3 is a diagram of a noninverting Bi-CMOS buffer according to the present invention. An inverter 21 is connected to the input of the buffer 20 to drive node N20 with the complement of the input signal on input 20. Accordingly, the input signal is available for use by the buffer circuitry as well and the complement of the input signal. The input signal and its complement are then connected to two passgates. The first passgate, comprised of N channel transistor Q20 and P channel transistor Q21, is connected between ground and a passgate output node N21. The second passgate, comprised of N channel transistor Q22 and P channel transistor Q23, is connected between Vcc and the passgate output node N21.

The N channel transistor Q20 of the first passgate and the P channel transistor Q23 of the second passgate are connected to the complement of the input signal on node N20. Due to this connection, only one of these two transistors is on at a time. The particular transistor that is on depends on whether node N20 is high or low.

Similarly, the N channel transistor Q22 of the second passgate and the P channel transistor Q21 of the first passgate are connected to the input signal itself on input 20. This way only one of these two transistors is on at a time. The particular transistor that is on depends on whether the input signal is high or low.

Passgate output node N21 is connected to the base of a first NPN bipolar transistor Q24. The collector of transistor Q24 is connected to Vcc and the emitter of transistor Q24 is connected to buffer output 22. Accordingly, a high voltage on node N21 will turn bipolar transistor Q24 on and a low voltage will turn bipolar transistor Q24 off.

A second NPN bipolar transistor Q28 is connected between the buffer output 22 and ground. The collector of transistor Q28 is connected to buffer output 22 and the emitter of transistor Q28 is connected to ground. The voltage on a node N22 which is connected to the base of transistor Q28 determines whether transistor Q28 is on or off.

A P channel transistor Q25 is connected between the buffer output 22 and node N22. The gate of this transistor Q25 is connected to the buffer input 20. An N channel transistor Q27 is connected between node N22 and ground to serve as a resistance to ground. The gate of transistor Q27 is therefore tied to Vcc.

Another transistor, N channel transistor Q26, is connected between buffer output 22 and node N22. The gate of this transistor Q26 is connected to node N20 to be connected to the complement of the buffer input signal.

Operation of the buffer is explained in two time periods. When the input 20 transitions low, for example, a first time period begins. The gate of P channel transistor Q21 of the first passgate is forced low due to its direct connection with input 20. Transistor Q21 is, therefore, turned on before the low transitioning input signal has been inverted by inverter 21. Simultaneously, N channel transistor Q22 of the second passgate is turned off. Accordingly, because the voltage on node N20 will still be low when the voltage on input 20 first begins going low, transistor Q23 will still be on. As a result, transistors Q21 and Q23 are both on to form a voltage divider between Vcc and ground. Node N21 is therefore driven with a voltage somewhat below Vcc. The base of bipolar transistor Q24 therefore begins to fall after only one transistor delay through transistors Q21 and Q22. When the base of bipolar transistor Q24 falls, bipolar transistor Q24 begins to turn off.

The speed of the voltage drop on node N21 is adequate to initiate the switching off transistor Q24 because the voltage on the buffer output 22 was initially at approximately Vcc−0.7 volts. Node N21 therefore only need be dropped slightly below Vcc to begin switching transistor Q24 off.

Also, during the first time period, the gate of P channel transistor Q25 is driven low due to the direct connection of the gate of the transistor Q25 to input 20. As a result, transistor Q25 turns on. Because the voltage on node N20 is still low when input 20 first begins transitioning low, transistor Q26 remains off. As a result, resistive transistor Q27, nonconducting transistor Q26, and conducting transistor Q25 form a voltage divider between buffer output 22 and ground. The voltage on node N22 therefore increases from ground to the voltage output by the voltage divider network. As a result, bipolar transistor Q28 starts to turn on.

In one embodiment, the effective on resistance of transistor Q27 is approximately 20 kΩ and the effective on resistance of transistor Q26 is approximately 0.5 kΩ. Transistor Q27 is therefore used to discharge the base of transistor Q28 to prevent it from floating high when transistors Q26 and Q25 are off. The discharging of the base of transistor Q28 can be accomplished with a small current and a transistor Q27 can have an approximate width to length ratio of W/L=2/5.

Then, at the beginning of the second time period, inverter 21 finally outputs a high voltage level on node N20. When node N20 goes high, transistor Q20 of the first passgate is turned on. Transistors Q20 and Q21 of the first passgate are therefore both on. Similarly, node N20 going high turns transistor Q23 off. Transistors Q22 and Q23 of the second passgate are therefore both off. As a result, the voltage divider through transistors Q21 and Q23 is destroyed, node N21 is connected to ground through the first passgate, the voltage on node N21 decreases further toward ground, and bipolar transistor Q24 is turned completely off.

Also in the beginning of the second time period, the gate of N channel transistor Q26 is driven high. As a result, transistor Q26 is turned on. Because transistor Q25 was already turned on in the first time period, both transistors Q26 and Q25 function to pull node N22 higher against the load of resistive transistor Q27. Bipolar transistor Q28 is therefore turned on even more strongly that it was in the first period.

One function of transistor Q26 is to prevent charge from becoming trapped on node N22 due to transistor Q25 being a P-channel transistor rather than a N channel transistor. If the resistance of transistor Q27 is adequately low, if the switching frequency of the input signal on input 20 is adequately high, and if transistor Q25 is a P-channel transistor, the base of transistor Q28 may not be discharged to the collector of transistor Q28 when input 20 transitions low. In this situation, the P-channel transistor Q25 will only pull the voltage on node N22 to a voltage of one threshold voltage $V_T$ below the voltage on output 22. If Q28 is in deep saturation, the voltage on the collector of transistor Q28 may be as low as approximately 0.2 volts. The base of transistor Q28 will therefore not be discharged through a P channel transistor. If, on the other hand, an extra N channel transistor Q26 is included, charge from the base of a saturated transistor Q28 will pass to the collector of transistor Q28 and the voltage on node N22 will increase due to the series base resistance $r_b$ of transistor Q28. A saturated transistor Q28 will therefore be pulled out of saturation. If transistor Q28 going into saturation is not a problem, the N channel transistor Q26 need not be incorporated.

Figure 1:
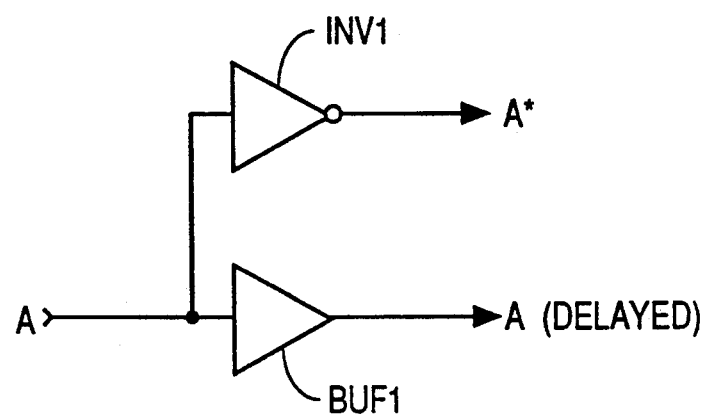
FIG. 1 (PRIOR ART) is an application in which a Bi-CMOS noninverting buffer with a propagation delay of a single Bi-CMOS inverter is desirable.
Figure 2:
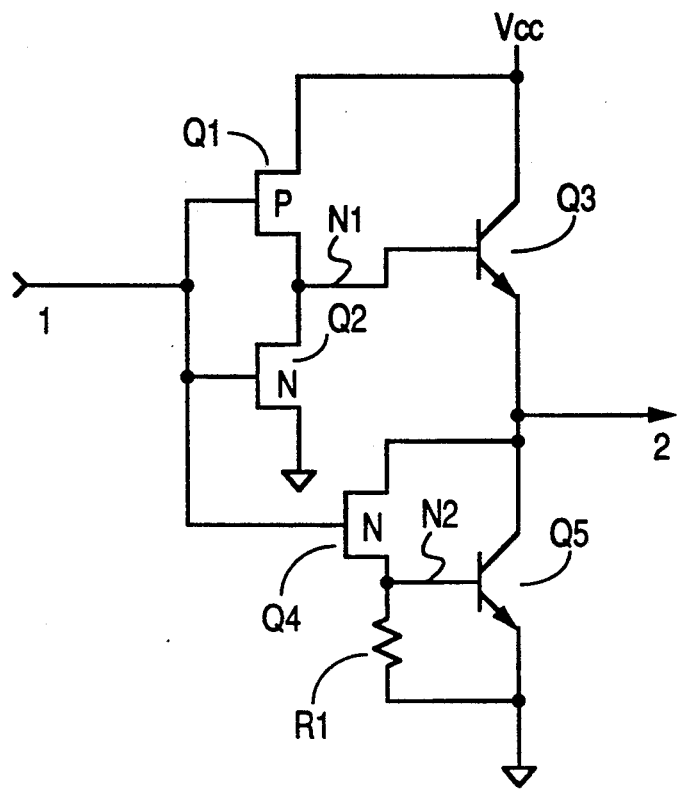
FIG. 2 (PRIOR ART) is a diagram of a conventional Bi-CMOS inverter.

Whether or not a transistor Q26 is provided, the output of the Bi-CMOS buffer circuit begins to transition after the switching delay through a single MOS transistor plus the propagation delay of an output bipolar transistor Q24 or Q28. This total propagation delay through the Bi-CMOS buffer is roughly the same as the propagation delay through the conventional Bi-CMOS inverter of FIG. 2. The output of the conventional Bi-CMOS inverter of FIG. 2 begins to switch after the switching delay through one MOS transistor plus the propagation delay of an output bipolar transistor Q3 or Q5.

Figure 4:
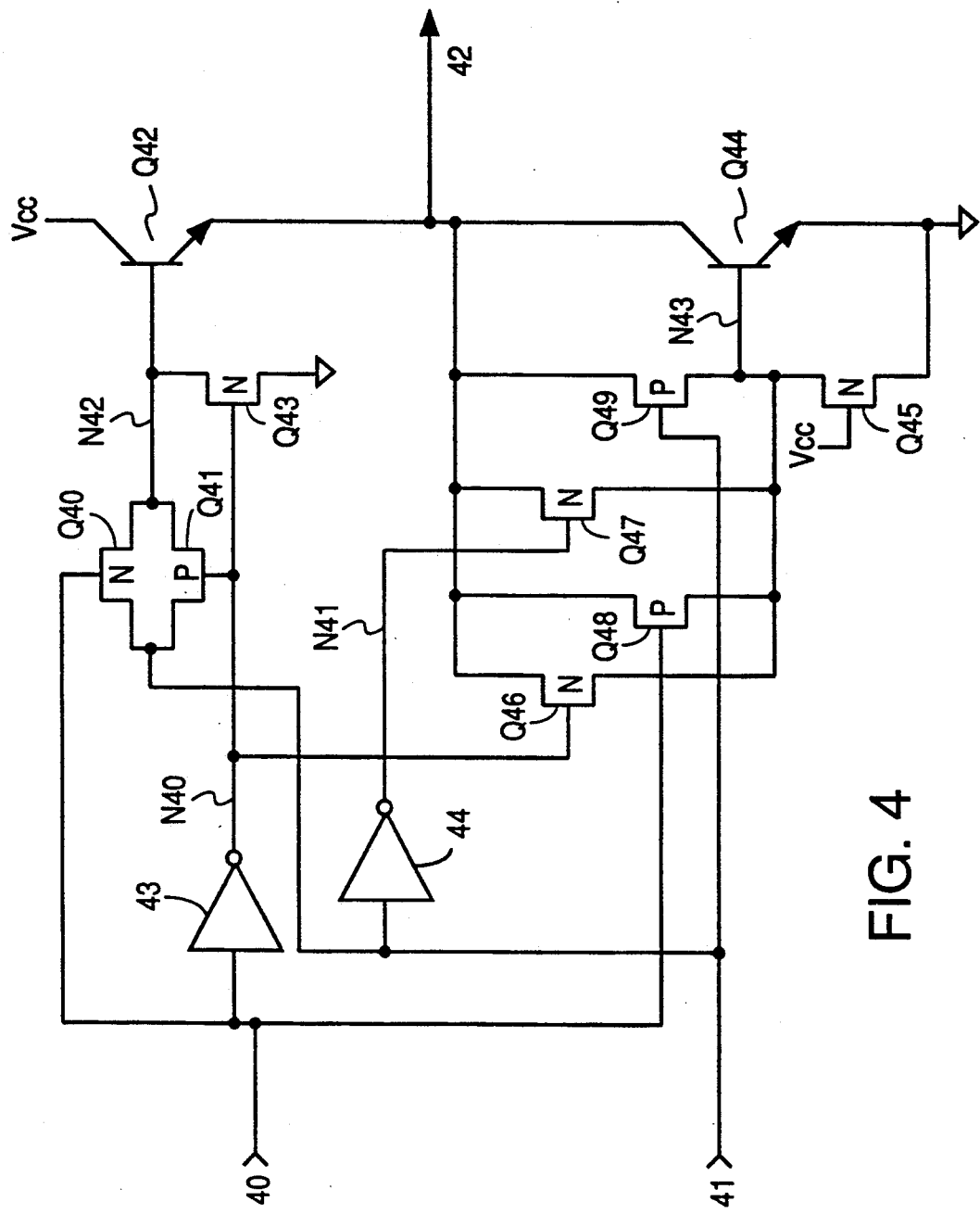
FIG. 4 is a diagram of an example of a Bi-CMOS AND gate according to the present invention.

FIG. 4 is a circuit diagram of an AND gate according to the present invention. This AND gate is but one example of a gate according to the present invention. This AND gate has a first input 40, a second input 41, and one output 42. The first input 40 is connected to the input of a first inverter 43. The second input 41 is connected to the input of a second inverter 44. Inverter 43 generates the complement of the signal on first input 40. This complement is output by inverter 43 onto node N40. Similarly, inverter 44 outputs the complement of the signal on second input 41 onto node N41.

A passgate formed by N channel MOS transistor Q40 and P channel MOS transistor Q41 is connected between second input 41 and a passgate output node N42. The gate of P channel transistor Q41 is connected to node N40. The gate of the N channel transistor Q40 is connected to the first input 40. The passgate output node N42 is connected to the base of a first NPN bipolar output transistor Q42. The collector of bipolar transistor Q42 is connected to the AND gate output 42. An N channel transistor Q43 is connected between node N42 and ground. The gate of transistor Q43 is connected to node N40.

A second NPN bipolar output transistor Q44 is also provided. The collector of transistor Q44 is connected to the AND gate output 42. The emitter of the transistor Q44 is connected to ground. The base of bipolar transistor Q44 is connected to node N43.

Two N channel transistors Q46 and Q47 are connected between the AND gate output 42 and node N43. Two P channel transistors Q48 and Q49 are connected between AND gate output 42 and node N43. The gate of transistor Q46 is connected to node N40; the gate of transistor Q48 is connected to first input 40; the gate of transistor Q47 is connected to node N41; and the gate of transistor Q49 is connected to second input 41. Another N channel transistor Q45 is connected between node N43 and ground. The gate of transistor Q45 is tied to Vcc.

In operation, if first input 40 and second input 41 are both high, the output 42 will be driven high. If input 40 is high, transistor Q40 is turned on. Transistor Q41 is turned on due to the low voltage placed on node N40 by inverter 43. Transistor Q43 is an N channel transistor and therefore is off when node N40 is low. Because input 41 is high, a high signal passes through the passgate formed by transistors Q40 and Q41 and passes onto the base of bipolar transistor Q42 at node N42. Bipolar transistor Q42 is therefor turned on.

Because input 40 is directly connected to P channel transistor Q48 and because input 41 is directly connected to P channel transistor Q49, both transistors Q48 and Q49 are off. Similarly, because N channel transistors Q46 and Q47 are driven by inverters 43 and 44, nodes N40 and N41 are both low and transistors Q46 and Q47 are off. As a result, the voltage on node 43 is pulled to ground by resistive transistor Q45 so that the base of bipolar transistor Q44 is held. Transistor Q44 is therefore off. With bipolar transistor Q42 being on and bipolar transistor Q44 being off, the voltage on output 42 is high.

In the condition that either input 40 or input 41 is low, either node N40 or node N41 will be driven high by an inverter and one of N channel transistors Q46 or Q47 will be on. Additionally, if either input 40 or input 41 is low, one of P channel transistors Q48 and Q49 will be turned on due to their direct connections with the inputs. As a consequence, the base of bipolar transistor Q44 will be coupled to the collector of transistor Q44.

Furthermore, if input 40 is low, the passgate formed by N channel transistor Q40 and P channel transistor Q41 will be turned off. Node N42 will be pulled to ground by N channel transistor Q43 because the gate of N channel transistor Q43 is connected to node N40 which is driven with a high signal by inverter 43. If, on the other hand, input 40 is high but input 41 is low, the passgate formed by transistors Q40 and Q41 will be on to pass the low voltage on input 41 onto node N42 and the base of bipolar transistor Q42. It is therefore seen that if either input 40 or input 41 is low, bipolar transistor Q42 is off and bipolar transistor Q44 is on. The voltage on output 42 therefore is low when either or both of inputs 40 and 41 is low. Accordingly, the circuit of FIG. 4 performs an AND function. N channel transistors Q46 and Q47 of FIG. 4 are added to ensure that the voltage on the base of bipolar transistor Q44 can be increased in the condition that transistor Q44 is in deep saturation. In some embodiments, transistors Q46 and Q47 are not necessary and are therefore need not be included.

Although specific embodiments of the present invention are described in the foregoing disclosure, it is evident that multiple adaptations to other semiconductor technologies as well as other logic gates will become apparent to those skilled in the art. Accordingly, this description is to be construed as illustrative only and is for the purpose of teaching one manner of carrying out the invention. Specifics of the embodiments described above are therefore not intended to limit the true scope of the invention as set forth in the appended claims.

I claim:
1. A digital logic circuit, comprising:
   a first inverting means for inverting a digital logic level present on an input signal conductor and for outputting the digital logic level opposite said digi- tal logic level present on the input signal conductor onto an first inverting means output;

a first passgate means for conditionally varying a resistance between a node of a first potential and a passgate output node, the first passgate means comprising an N channel transistor and a P channel transistor, a gate of the N channel transistor of the first passgate means being coupled to the first inverting means output, a gate of the P channel transistor of the first passgate means being coupled to the input signal conductor;

a second passgate means for conditionally varying a resistance between a node of a second potential and said passgate output node, the second passgate means comprising an N channel transistor and a P channel transistor, a gate of the N channel transistor of the second passgate means being coupled to the input signal conductor, a gate of the P channel transistor of the second passgate means being coupled to the first inverting means output;

a first output transistor means for controlling current flow between said node of said second potential and an output signal conductor, a control electrode of said first output transistor means being coupled to said passgate output node;

a second output transistor means for controlling current flow between said output signal conductor and said node of said first potential; and a second inverting means for inverting the digital logic level present on the input signal conductor and for outputting a level opposite said digital logic level present on the input signal conductor onto a control electrode of said second transistor means.

2. The digital logic circuit of claim 1, wherein said first output transistor means comprises a bipolar transistor, and wherein said second output transistor means comprises a bipolar transistor.

3. The digital logic circuit of claim 1, wherein said first potential is a substrate voltage of a semiconductor chip, and wherein said second potential is positive with respect to the substrate voltage.

4. The digital logic circuit of claim 1, wherein said second inverting means comprises a switching means, connected between said output signal conductor and said control electrode of the second output transistor means, for controlling a voltage present on said control electrode of the second output transistor means.

5. The digital logic circuit of claim 4, wherein said switching means comprises an N channel MOS transistor, the gate of said N channel MOS transistor of the switching means being coupled to said first inverting means output.

6. The digital logic circuit of claim 4, wherein said switching means comprises a P channel MOS transistor, the gate of said P channel MOS transistor of the switching means being coupled to said input signal conductor.

7. The digital logic circuit of claim 4, wherein said switching means comprises an N channel MOS transistor, the gate of said N channel MOS transistor of the switching means being coupled to said first inverting means output, and wherein said switching means also comprises a P channel MOS transistor, the gate of said P channel MOS transistor of the switching means being coupled to said input signal conductor.

8. The digital logic circuit of claim 6, wherein said switching means also comprises a resistive element connected between the control electrode of the second output transistor means and said node of said first potential.

9. A circuit, comprising:

an inverting means for inverting a digital logic level present on an input signal conductor and for outputting the digital logic level opposite said digital logic level present on the input signal conductor onto a first inverting means output;

a passgate means for conditionally varying a resistance between a first passgate node and a second passgate node, the passgate means comprising an N channel transistor and a P channel transistor, a gate of the N channel transistor of the passgate means being coupled to the inverting means output, a gate of the P channel transistor of the passgate means being coupled to the input signal conductor;

a first bipolar output transistor means for controlling current flow between a first supply voltage and an output signal conductor, a base electrode of said first bipolar output transistor means being connected to said second passgate node; and a second bipolar output transistor means for controlling current flow between said output signal conductor and a second supply voltage, the second bipolar output transistor means comprising an MOS transistor connected between said output signal conductor and a control node of said second bipolar output transistor means, the second bipolar output transistor means also comprising a resistive element connected between said control node of said second bipolar output transistor means and said second supply voltage, the resistive element having a resistance which is substantially independent of a voltage on said input signal conductor.

10. A circuit, comprising:

an inverting means for inverting a digital logic level present on an input signal conductor and for outputting the digital logic level opposite said digital logic level present on the input signal conductor onto a first inverting means output;

a passgate means for conditionally varying a resistance between a first passgate node and a second passgate node, the passgate means comprising an N channel transistor and a P channel transistor, a gate of the N channel transistor of the passgate means being coupled to the inverting means output, a gate of the P channel transistor of the passgate means being coupled to the input signal conductor;

a first bipolar output transistor means for controlling current flow between a first supply voltage and an output signal conductor, a control electrode of said first bipolar output transistor means being coupled to said second passgate node; and a second bipolar output transistor means for controlling current flow between said output signal conductor and a second supply voltage, the second bipolar output transistor means comprising an MOS transistor connected between said output signal conductor and a control node of said second bipolar output transistor means, the second bipolar output transistor means also comprising a resistive element connected between said control node of said second bipolar output transistor means and said second supply voltage, a gate of said MOS transistor of the second bipolar output transistor means being coupled to said input signal conductor.

11. The circuit of claim 9, wherein a gate of said MOS transistor of the second bipolar output transistor means is coupled to said first inverting means output.

12. The circuit of claim 10, wherein said MOS transistor is a P channel transistor.

13. The circuit of claim 11, wherein said MOS transistor is an N channel transistor.

14. A digital logic circuit having a first input signal conductor, a second input signal conductor, and an output signal conductor, the digital logic circuit comprising:

a first inverting means for inverting a digital logic level present on the first input signal conductor and for outputting the digital logic level opposite said digital logic level present on the first input signal conductor onto a first inverting means output;

a passgate means directly connected to the second signal input conductor for conditionally varying a resistance between the second input signal conductor and an output node of the passgate means, the passgate means comprising an N channel transistor and a P channel transistor, a gate of the P channel transistor of the passgate means being coupled to the first inverting means output, a gate of the N channel transistor of the passgate means being coupled to the first input signal conductor;

a first output transistor means for controlling current flow between a first supply voltage and the output signal conductor, a control electrode of said first output transistor means being coupled to said output node of the passgate means;

a second output transistor means for controlling current flow between said output signal conductor and a second supply voltage, said second output transistor means having a control electrode; and a logic means for controlling a voltage on said control electrode of said second output transistor means such that said voltage on said control electrode of said second output transistor means is a logical NAND of voltages on said first and second input signal conductors, said logic means having a first input which is coupled to said first input signal conductor, said logic means also having a second input which is coupled to said second input signal conductor.

15. The digital logic circuit of claim 14, wherein said logic means further comprises:

a first MOS transistor connected between the output signal conductor and the control electrode of the second output transistor means, a gate of said first MOS transistor of the logic means being coupled to said first input of said logic means; and a second MOS transistor connected in parallel with the first MOS transistor between the output signal conductor and the control electrode of the second output transistor means, a gate of said second MOS transistor of the logic means being coupled to said second input of said logic means.

16. The digital logic circuit of claim 15, further comprising:

a second inverting means for inverting a digital logic level present on the second input signal conductor and for outputting the digital logic level opposite said digital logic level present on the second input signal conductor onto a second inverting means output, wherein said logic means further comprises:

a third MOS transistor connected between the output signal conductor and the control electrode of the second output transistor means, a gate of said third MOS transistor of the logic means being coupled to said first inverting means output; and a fourth MOS transistor connected between the output signal conductor and the control electrode of the second output transistor means, a gate of said second MOS transistor of the logic means being coupled to said second inverting means output.

17. The digital logic circuit of claim 15, wherein said logic means further comprises a resistive element connected between said control electrode of said second output transistor means and said second supply voltage.

18. The digital logic circuit of claim 16, wherein said logic means further comprises a resistive element connected between said control electrode of said second output transistor means and said second supply voltage.

19. The digital logic circuit of claim 16, wherein said first output transistor means comprises:

a bipolar transistor, a collector of the bipolar transistor being coupled to the first supply voltage, an emitter of the bipolar transistor being coupled to the output signal conductor, a base of the bipolar transistor being coupled to the output node of the passgate means.

20. The digital logic circuit of claim 19, wherein said first output transistor means further comprises:

a MOS transistor connected between the base of the bipolar transistor of the first output transistor means and the second supply voltage, a gate of the MOS transistor of the first output transistor means being coupled to the first inverting means output.

21. A digital logic circuit having an input and an output, comprising:

a passgate having a data input, a data output, a first control input, and a second control input, said first control input being coupled to said input of said digital logic circuit;

a bipolar transistor having a first, a second, and a third terminal said first terminal being coupled to a first supply voltage, said second terminal being coupled to said data output of said passgate, said third terminal being coupled to said output of said digital logic circuit; and means for inverting having an input and an output, said input of said means for inverting being coupled to said input of said digital logic circuit, said output of said means for inverting being coupled to said second control input of said passgate, wherein said data input of said passgate is coupled to said first supply voltage or a second supply voltage.

22. A digital logic circuit having an input and an output, comprising:

a passgate having a data input, a data output, a first control input, and a second control input, said first control input being coupled to said input of said digital logic circuit;

a bipolar transistor having a first, a second, and a third terminal said first terminal coupled to a first supply voltage, said second terminal being coupled to said data output of said passgate, said third terminal being coupled to said output of said digital logic circuit; and means for inverting having an input and an output, said input of said means for inverting being coupled to said input of said digital logic circuit, said output of said means for inverting being coupled to said second control input of said passgate, wherein said data input of said passgate is coupled to ground.

23. A digital logic circuit having an input and an output, comprising:
   a passgate having a data input, a data output, a first control input, and a second control input, said first control input being coupled to said input of said digital logic circuit;
   a bipolar transistor having a first, a second, and a third terminal, said second terminal being connected directly to said data output of said passgate, said third terminal being coupled to said output of said digital logic circuit;
   means for inverting having an input and an output, said input of said means for inverting being coupled to said input of said digital logic circuit, said output of said means for inverting being coupled to said second control input of said passgate; and
   means for switching, said means for switching having a first terminal, a second terminal, and a third terminal, said first terminal of said means for switching being coupled to said second terminal of said bipolar transistor, said second terminal of said means for switching being coupled to said output of said means for inverting, said third terminal being coupled to a supply voltage.

24. The digital logic circuit of claim 23, wherein said digital logic circuit has a second input, and wherein said data input of said passgate is coupled to said second input of said digital logic circuit.

25. The digital logic circuit of claim 23, wherein said means for inverting is a CMOS inverter.

26. The digital logic circuit of claim 23, wherein said first terminal of said bipolar transistor is coupled to a supply voltage, the supply voltage to which said first terminal is coupled being a different voltage than the supply voltage to which said third terminal of the means for switching is coupled.

27. The digital logic circuit of claim 23, wherein said circuit comprises part of a BiCMOS AND gate, said input of said digital logic circuit being an input of said AND gate, said output of said digital logic circuit being an output of said AND gate.

28. The digital logic circuit of claim 23, wherein said means for switching is an N channel transistor.

* * * * *

UNITED STATES PATENT AND TRADEMARK OFFICE
CERTIFICATE OF CORRECTION

Page 1 of 2

PATENT NO. : 5,243,237

DATED : September 7, 1993

INVENTOR(S) : Cong Khieu

It is certified that error appears in the above-identified patent and that said Letters Patent is hereby corrected as shown below:

Title page, item [57],
In the Abstract, line 16,
 delete "delay" and insert --delays--.

Col. 2, line 17,
 after "ground" insert a period --.--.

Col. 3, line 20,
 delete "and" and insert --as--.

Col. 4, line 11,
 after "The" insert --voltage on the--.

Col. 4, line 13,
 after "When" insert --the voltage on--.

Col. 4, line 17,
 after "off" insert --of--.

Col. 6, line 19,
 delete "43" and insert --N43--.

Col. 6, line 21,
 after "held" insert --low--.

UNITED STATES PATENT AND TRADEMARK OFFICE
CERTIFICATE OF CORRECTION

PATENT NO. : 5,243,237
DATED : September 7, 1993
INVENTOR(S) : Cong Khieu

It is certified that error appears in the above-indentified patent and that said Letters Patent is hereby corrected as shown below:

Col. 6, line 52, delete "are", second occurrence.

Signed and Sealed this

Fifth Day of April, 1994

*Attest:*

BRUCE LEHMAN

*Attesting Officer*     *Commissioner of Patents and Trademarks*